(12) United States Patent
Kwon et al.

(10) Patent No.: US 9,042,167 B2
(45) Date of Patent: May 26, 2015

(54) PHASE CHANGE MEMORY

(75) Inventors: Duk-Min Kwon, Seoul (KR); Ki Whan Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 392 days.

(21) Appl. No.: 13/540,979

(22) Filed: Jul. 3, 2012

(65) Prior Publication Data

US 2013/0051138 A1    Feb. 28, 2013

(30) Foreign Application Priority Data

Aug. 31, 2011 (KR) .................... 10-2011-0087616

(51) Int. Cl.
 *G11C 11/00* (2006.01)
 *G11C 5/14* (2006.01)
 *G11C 13/00* (2006.01)

(52) U.S. Cl.
 CPC ............ *G11C 5/145* (2013.01); *G11C 13/0004* (2013.01); *G11C 13/0038* (2013.01); *G11C 13/004* (2013.01); *G11C 13/0061* (2013.01); *G11C 13/0069* (2013.01); *G11C 13/0097* (2013.01)

(58) Field of Classification Search
 USPC ............ 365/46, 94, 100, 113, 129, 148, 158, 365/163; 257/2–5, 9, 296, 310, 379, 467, 257/E21.35, E31.047, E27.006; 438/29, 95, 438/96, 166, 135, 240, 259, 365, 382, 482, 438/486, 597; 977/754
 See application file for complete search history.

(56) References Cited

U.S. PATENT DOCUMENTS

| 7,015,736 | B1 | 3/2006 | Sudjian et al. |
| 7,602,876 | B2 | 10/2009 | Harrison |
| 2012/0155168 | A1* | 6/2012 | Kim et al. ................ 365/185.03 |

FOREIGN PATENT DOCUMENTS

| KR | 100172556 | 10/1998 |
| KR | 10-0265047 | 6/2000 |

\* cited by examiner

*Primary Examiner* — Harry W Byrne
(74) *Attorney, Agent, or Firm* — Onello & Mello LLP.

(57) ABSTRACT

A phase change memory device including a voltage generator that generates an operating voltage by generating at least one modified clock signal, a pulse width of which is maintained constant for at least one clock cycle in response to a pump enable signal being enabled, from at least one reference clock signal, and performing a pump operation on a power supply voltage according to the at least one modified clock signal; and a memory cell array that includes a plurality of phase change memory cells connected between word lines and bit lines. The operating voltage is applied to the memory cell array so as to perform a data access operation.

12 Claims, 15 Drawing Sheets

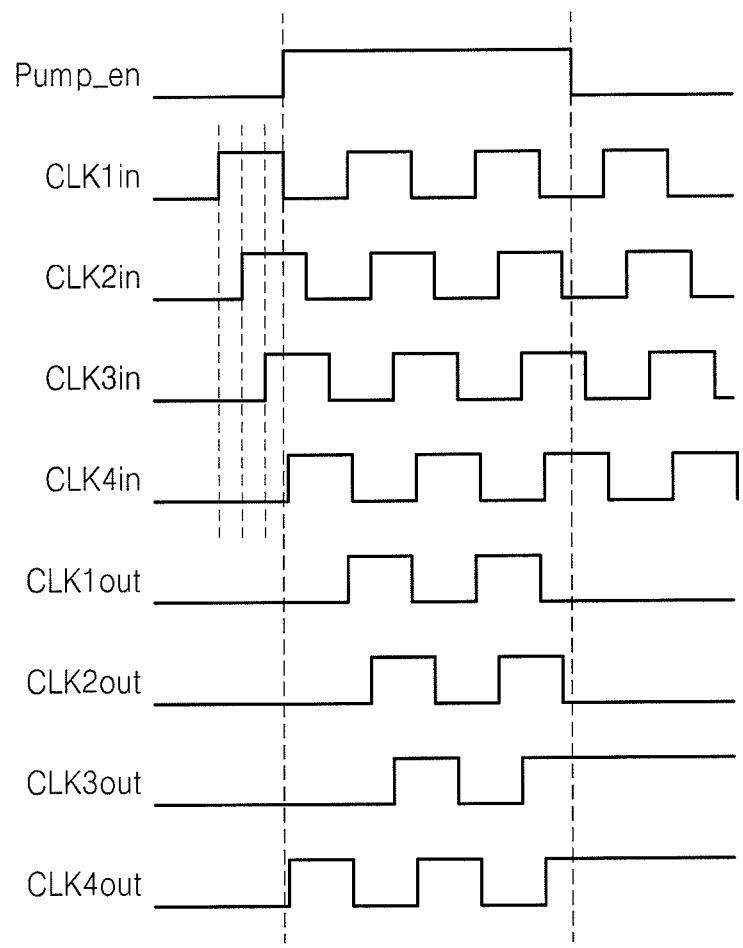

PHASE CHANGE MEMORY

CROSS-REFERENCE TO RELATED APPLICATIONS

This application claims the benefit of Korean Patent Application No. 10-2011-0087616, filed on Aug. 31, 2011, in the Korean Intellectual Property Office, the disclosure of which is incorporated herein in its entirety by reference.

BACKGROUND

One or more aspects of exemplary embodiments in accordance with inventive concepts relate to a semiconductor memory device, and more particularly, to a charge pump circuit of a phase change memory device, which is capable of improving charge pumping efficiency, and devices including the same.

A phase change memory is formed of a phase change material, such as a chalcogenide alloy, which may be maintained in one of two states, depending, for example, upon the rate at which it is heated and cooled. The two states, which may exhibit relatively low and high resistance, may correspond, respectively, to a crystalline state and an amorphous state, for example.

A phase change memory cell may store information using the difference between resistance values of memory element. The resistance values may correspond to the physical phase (that is, crystalline or amorphous) of the phase change material. Thus, the crystalline state may be defined as a set state or data '0', and the amorphous state may be defined as a reset state or data '1,' for example.

A phase change memory device may use a pump circuit to change a program current or voltage to be applied to the memory element thereof. A pump circuit may operate on a power supply voltage to generate a desired operating voltage, which may be higher than the power supply voltage.

There are various embodiments of pump circuits. A pump circuit may, for example, use a clock signal (hereinafter, referred to as a 'boosting clock signal') to generate an operating voltage, which may be referred to herein as a programming voltage, from a power supply voltage. The pumping circuit may perform a pump operation according to a cycle of a boosting clock signal, the pulse width of which is maintained constant while the pump circuit is activated.

However, when such a pump circuit switches from an activated mode to a deactivated mode, the boosting clock signal may have an insufficient pulse width. When the boosting clock signal does not have a sufficient pulse width, a pump enable signal indicating whether the pump circuit is activated may be changed from the activated mode, represented, for example, by a logic 'high', to the deactivated mode, represented, for example, by a logic 'low'. That is, if the pulse width of the boosting clock signal is not sufficient, the pump operation may be discontinued, thus causing a charge loss. With charge loss, a low sink current or a low programming voltage may be applied to the memory element, thereby degrading the performance of the pump operation and the phase change memory device.

SUMMARY

In exemplary embodiments in accordance with principles of inventive concepts, there is provided a phase change memory device including a voltage generator for generating an operating voltage by generating at least one modified clock signal, a pulse width of which is maintained constant for at least one clock cycle, from at least one reference clock signal, and performing a pump operation on a power supply voltage according to the at least one modified clock signal; and a memory cell array including a plurality of phase change memory cells connected between word lines and bit lines, wherein the operating voltage is applied to the memory cell array so as to perform a data access operation.

In an exemplary embodiment, the pulse width of the at least one modified clock signal may be maintained to be equal to or greater than half a pulse width of the at least one reference clock signal.

In an exemplary embodiment in accordance with principles of inventive concepts, there is provided a method of generating an operating voltage of a phase change memory device, the method including comparing a divided voltage, which is obtained by dividing a current operating voltage, with a reference voltage and then outputting a pump enable signal; generating at least one modified clock signal, the pulse width of which is maintained constant while the pump enable signal is enabled, from at least one reference clock signal; generating an operating voltage by performing a pump operation on a power supply voltage according to the at least one modified clock signal; and applying the operating voltage to a memory cell array to perform a data access operation.

A memory device in accordance with principles of inventive concepts includes a phase change memory cell array and an access source connected to provide access current to a selected memory cell within the array. The access source includes a latch circuit configured to provide a charge pump clock signal; a charge pump circuit connected to accept the charge pump clock signal and to provide current to an access current node; an input clock signal; a comparison circuit coupled to the access current node to compare the voltage at the access current node to a reference voltage and to generate an enable signal based on that comparison; and a gate circuit configured to gate the input clock signal and the enable signal and to operate the latch circuit.

A phase change memory in accordance with principles of inventive concepts may include a gate circuit that includes an exclusive-or (XOR) circuit configured to XOR a clock signal and a delayed clock signal and an AND circuit configured to AND the pump enable signal and the output of the XOR circuit.

In an exemplary embodiment in accordance with principles of inventive concepts, a phase change memory device may include a latch circuit that includes a flip flop configured as a toggle (T) flip flop; the output of the AND circuit is configured to clock the T flip flop; and the output of the T flip flop is configured to clock the charge pump circuit.

In an exemplary embodiment in accordance with principles of inventive concepts, a phase change memory device may include a gate circuit that includes a not-or (NOR) circuit configured to receive a clock signal, a delayed and inverted clock signal and an inverted pump enable signal and to output the result of the NOR operation to the clock input of a first T flip flop, and a (AND) circuit configured to receive the clock signal, the inverted and delayed clock signal and a pump signal and to output the result of the AND operation to the clock input of a second T flip flop; and a latch circuit that includes the first and second T flip flops connected to output their toggle outputs to the inputs of an XOR circuit which produces the charge pump clock signal.

In an exemplary embodiment in accordance with principles of inventive concepts, a phase change memory device includes a plurality of access sources connected to provide access current to a selected phase change memory cell.

BRIEF DESCRIPTION OF THE DRAWINGS

Exemplary embodiments of inventive concepts will be more clearly understood from the following detailed description taken in conjunction with the accompanying drawings in which:

FIG. 4B is a timing diagram of signals generated in the voltage generator of FIG. 4A, according to an exemplary embodiment in accordance with principles of inventive concepts;

DESCRIPTION

Figure 1:
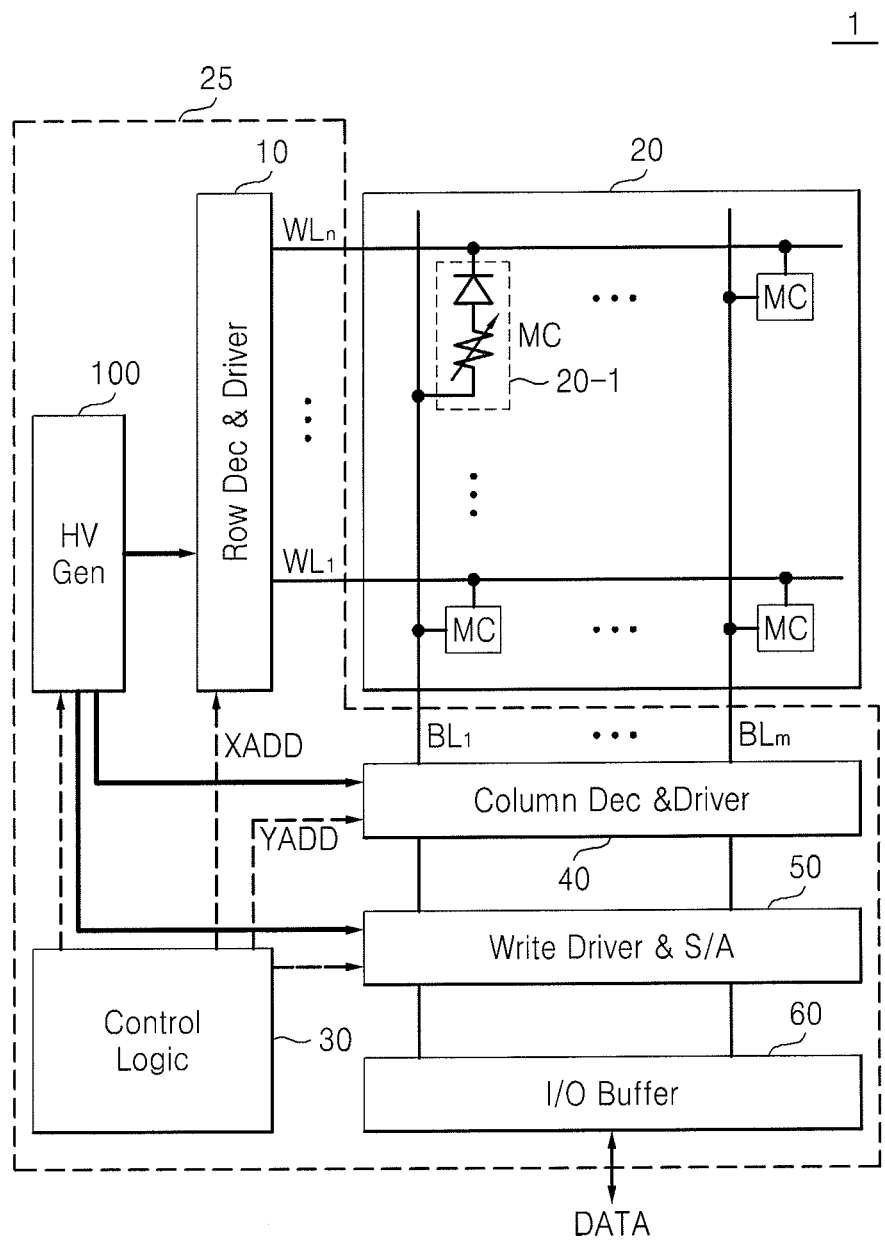
FIG. 1 is a block diagram of a phase change memory device according to an exemplary embodiment in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (for example, "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

A phase change memory device 1 in accordance with principles of inventive concepts is depicted in the block diagram of FIG. 1. Phase change memory device 1 may include a memory cell array 20, and an access circuit 25 for accessing memory cell array 20. Access circuit 25 may include row decoder and driver 10, control logic 30, column decoder and driver 40, write driver and sense amplifier (S/A) 50, input/output (I/O) buffer 60, and voltage generator 100.

Row decoder and driver 10 may select one of a plurality of word lines WL0 to WLn by decoding row addresses XADD received from control logic 30. Row decoder and driver 10 applies a relatively high voltage (higher, for example, than a supply voltage) generated by voltage generator 100 to the selected word line and/or the non-selected word lines according to a command given from control logic 30.

Memory cell array 20 includes the plurality of word lines WL0 to WLn, a plurality of bit lines BL0 to BLm, and a plurality of phase change memory cells 20-1 connected between the plurality of word lines WL0 to WLn and the plurality of bit lines BL0 to BLm.

Each of the plurality of phase change memory cells 20-1 may include a switching unit and a variable resistor element. The switching unit may be embodied using any of various devices, such as a MOS transistor and a diode, for example. The variable resistor element may include a phase change film formed of phase change material, such as germanium-antimony-tellurium, also referred to herein as GeSbTe, or GST material, for example. The plurality of phase change memory cells 20-1 may be nonvolatile, overwritable, memory cells.

During a data access operation, control logic 30 may control operations of row decoder and driver 10, column decoder and driver 40, write driver and S/A 50, and voltage generator 100 to access any of the plurality of phase change memory cells 20-1. That is, the control logic 30 may control overall operations of phase change memory device 1. The term "data access operation" may refer herein to operations such as a read operation, a program operation, a verify operation, or an erase operation.

Although not shown, write driver and S/A 50 may include a current S/A or a voltage S/A, for example. The write driver included in the write driver and S/A 50 may be controlled by control logic 30, and may supply a write current to a data line according to data received via the I/O buffer 60. The S/A included in write driver and S/A 50 may sense data by comparing a voltage of a sensing node (for example, an input terminal of the S/A) to a reference voltage Vref. The sensing node may be connected to a current path formed between the S/A and a phase change memory cell selected from among the plurality of phase change memory cells 20-1. For example, if the voltage of the sensing node is higher than reference voltage Vref, the sensed data may be determined to be logic 'high' and that logic value may then be output. On the other hand, if the voltage of the sensing node is lower than reference voltage Vref, the sensed data may be determined to be logic 'low' and that logic value may then be output. If the sensed data is determined to be logic 'high', the selected phase change memory cell 20-1 has a high resistance state. If the sensed data is determined to be logic 'low', the selected phase change memory cell 20-1 has a low resistance state. The sensed data may be output to the outside, that is, to circuitry outside the memory cell array, via I/O buffer 60.

Column decoder and driver 40 decodes column addresses YADD received from control logic 30 to select one of the plurality of bit lines BL0 to BLm. For example, a nonvolatile memory cell, e.g., one of the phase change memory cells 20-1, which is to be accessed during a data access operation may be selected by using row decoder and driver 10 and column decoder and driver 40.

When current is supplied to the selected phase change memory cells 20-1, I/O buffer 60 may read data DATA from the selected phase change memory cell 20-1 by sensing a voltage, or a change in a voltage of the sensing node, caused by current flowing through the selected phase change memory cell 20-1.

Voltage generator 100 is controlled by control logic 30, and generates a relatively high voltage to be used in row decoder and driver 10, column decoder and driver 40, and the write driver and S/A 50. In an exemplary embodiment in accordance with principles of inventive concepts, voltage generator 100 may be embodied using a charge pump.

Voltage generator 100 may generate a plurality of voltages such as, for example, a program voltage Vpgm, for performing a program operation, a plurality of voltages, e.g., read voltages Vred and Vrd, for performing a read operation, or an erase voltage Vera, for performing an erase operation. Such voltages (hereinafter, referred to as 'operating voltage') may be applied to row decoder and driver 10, under control of control logic 30. An exemplary embodiment of a voltage generator 100 in accordance with principles of inventive concepts will be described in detail below.

Figure 2:
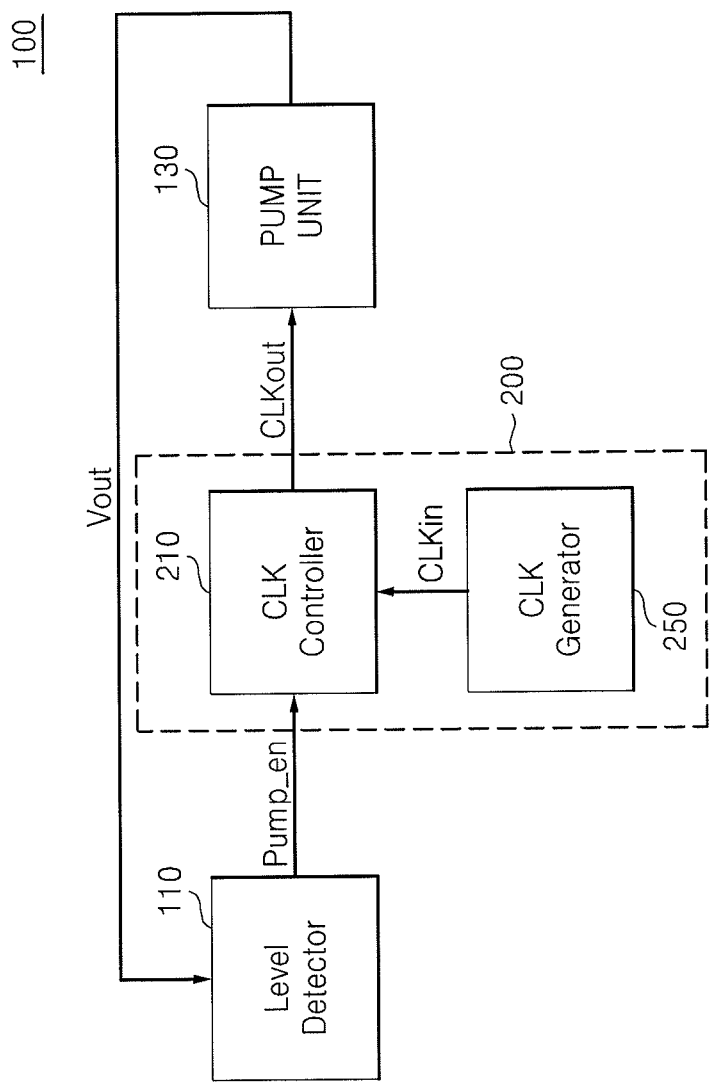
FIG. 2 is a block diagram of a voltage generator illustrated in FIG. 1, according to an exemplary embodiment in accordance with principles of inventive concepts.

A voltage generator 100 in accordance with principles of inventive concepts is depicted in the block diagram of FIG. 2. Voltage generator 100 generates an operating voltage Vout by generating at least one modulated clock signal CLKout and performing a pump operation on a power supply voltage according to clock signal CLKout. Voltage generator 100 may employ a reference clock signal CLKin (see, for example, FIG. 3A) to maintain the pulse-width of clock signal CLKout at a constant value while pump enable signal Pump_en is enabled (that is, while Pump_en is activated, indicating that the pump should be "ON"). In an exemplary embodiment in accordance with principles of inventive concepts, voltage generator 100 includes level detector 110, pump unit 130, and clock driver 200.

Level detector 110 generates pump enable signal Pump_en by comparing a divided voltage DIV of operating voltage Vout to reference voltage Vref. Clock driver 200 generates the at least one modulated clock signal CLKout, the pulse width of which is maintained constant while pump enable signal Pump_en is enabled. Pump unit 130 performs the pump operation on the power supply voltage, employing the at least one modulated clock signal CLKout to generate operating voltage Vout.

Clock driver 200 may include clock generator 250 and clock controller 210. Clock generator 250 generates the at least one reference clock signal CLKin, and clock controller 210 generates the at least one modulated clock signal CLKout, the pulse width of which is maintained constant while pump enable signal Pump_en is enabled.

Figure 3A:
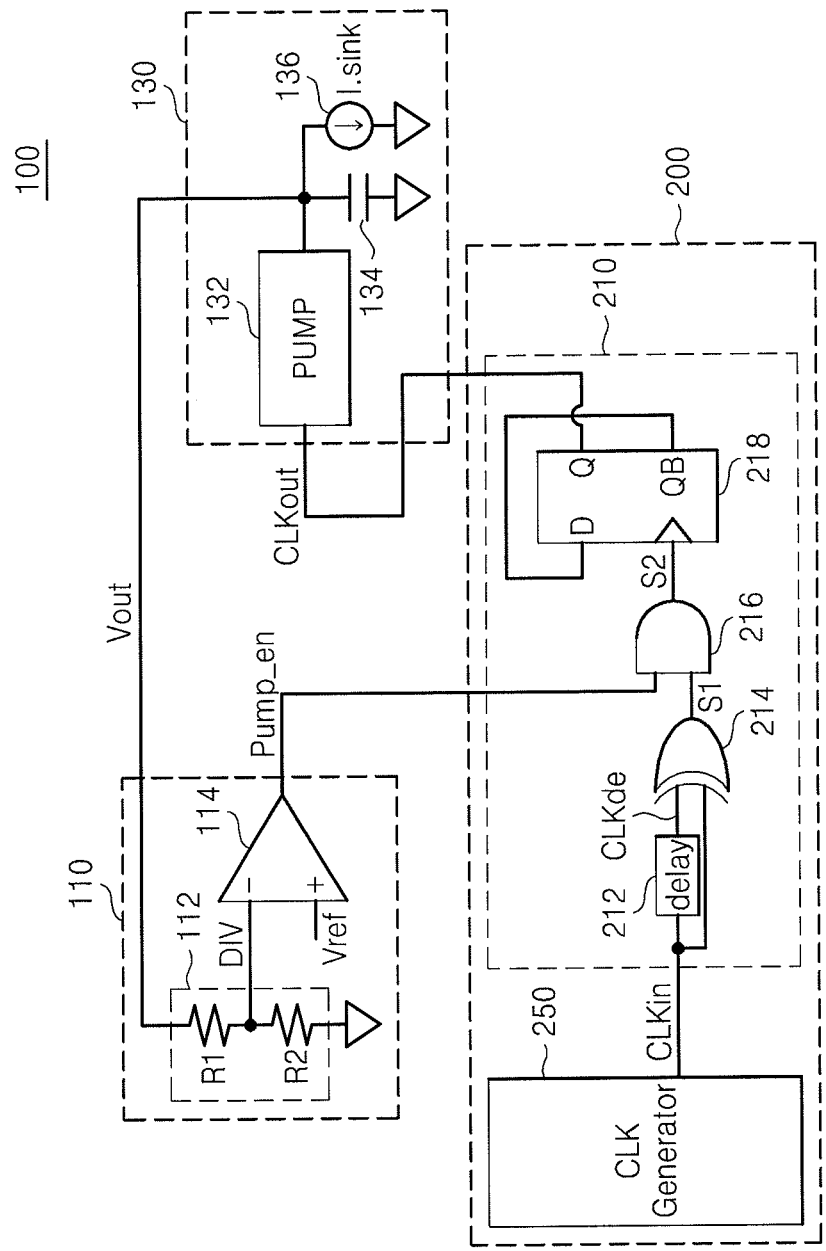
FIG. 3A is a detailed circuit diagram of the voltage generator of FIG. 2, according to an exemplary embodiment in accordance with principles of inventive concepts.
Figure 3B:
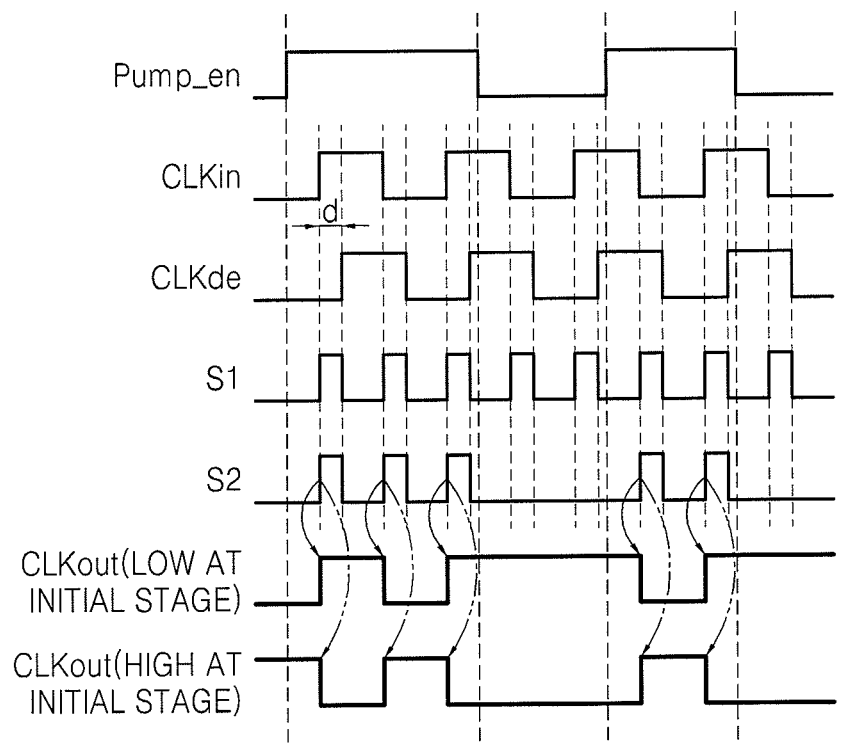
FIG. 3B is a timing diagram of signals generated in the voltage generator illustrated in FIG. 3A, according to an exemplary embodiment in accordance with principles of inventive concepts.

The structure and operation of an exemplary embodiment of voltage generator 100 in accordance with principles of inventive concepts will now be described in more detail with reference to FIG. 3A and FIG. 3B. FIG. 3A is a circuit diagram of voltage generator 100 of FIG. 2 and FIG. 3B is a timing diagram of signals generated in voltage generator 100 illustrated in FIG. 3A, according to an exemplary embodiment in accordance with principles of inventive concepts.

Referring to FIG. 3A, level detector 110 includes a reference voltage generator (not shown), voltage divider 112, and comparator 114. The reference voltage generator (not shown) applies a reference voltage Vref.

Voltage divider 112 generates a divided voltage DIV by dividing operating voltage Vout. Voltage divider 112 may include at least two resisters. In an exemplary embodiment, voltage divider 112 includes a first resistor R1 and a second resistor R2 connected in series between an operating voltage Vout source terminal and a ground voltage source terminal. A voltage applied to a node connecting the first resistor R1 and the second resistor R2 is applied as divided voltage DIV to comparator 114.

Comparator 114 compares reference voltage Vref to divided voltage DIV, and outputs a pump enable signal Pump_en according to the results of the comparison. For example, when divided voltage DIV is lower than reference voltage Vref, the value of pump enable signal Pump_en may be a first, high, logic level. Operating voltage Vout is determined by:

$$Vout=(1+R1/R2)*DIV$$

In an exemplary embodiment, clock driver 200 includes clock controller 210 and clock generator 250, and generates a modulated clock signal CLKout, a predetermined pulse width of which is maintained constant regardless of a sink current, from a reference clock signal CLKin, when the pump enable signal Pump_en is supplied to clock deriver 200.

Clock generator 250 generates at least one reference clock signal CLKin and supplies it to pump circuit 130 or clock controller 210. If two or more reference clock signals CLKin are generated, they may be clock signals that have the same pulse cycle but have different phases so that these signals do not overlap with one another, for example.

Clock controller 210 may include delayer 212, first logic operation unit 214, second logic operation unit 216, and flip flop 218.

In an exemplary embodiment in accordance with principles of inventive concepts, delayer 212 delays reference clock signal CLKin for a predetermined time to generate a delayed reference clock signal CLKde. The predetermined time may be less than or equal to half a cycle of reference clock signal CLKin, for example.

First logic operation unit 214 performs a first logic operation on reference clock signal CLKin and the delayed reference clock signal CLKde, and outputs a modified signal S1 as a result. First logic operation may be an XOR operation, for example. Second logic operation unit 216 performs a second logic operation on pump enable signal Pump_en and modified signal S1 and outputs a modified signal S2 as a result. The second logic operation may be an AND operation, for example. In other words, modified signal S1 is generated by subdividing a cycle of reference clock signal CLKin according to a predetermined time. Modified enable signal S2 is generated by correlating modified signal S1 with pump enable signal Pump_en. In this manner, it is possible to prevent pump enable signal Pump_en from insufficiently covering edges of reference clock signal CLKin.

In an exemplary embodiment in accordance with principles of inventive concepts the state of delay, or, simply, "D," flip flop 218 is altered by the rising edge of signal S2. Because the inverted output, QB, of flip flop 218 is fed to its D input, the output Q toggles, from high to low, and low to high, with the rising edge of signal S2. Although the exemplary embodiment of FIG. 3A employs a D flip flop, the inventive concept is not limited thereto and other types of flip flops, such as RS, T, or JK flip flop may be employed in accordance with principles of inventive concepts.

Pump unit 130 pumps an input voltage, such as a power supply voltage to a higher level under control of modulated clock signal CLKout. In accordance with principles of inventive concepts, the voltage output from pump unit 130 may be used as an operating voltage of a phase change memory device. In various embodiments in accordance with principles of inventive concepts, pump unit 130 may be a Dickson charge pump, a four-phase charge pump, or a cross-coupled charge pump, for example.

Pump unit 130 may include pump circuit 132 that performs the pump operation to generate an operating voltage, a capacitor 134 that is temporarily charged with the operating voltage, and a discharge current source 136 that discharges current Is at a predetermined level corresponding to the operating voltage.

The timing diagram of FIG. 3B will be used to describe the operation of an exemplary embodiment of a voltage generator 100 in accordance with principles of inventive concepts such as illustrated in the block diagram of FIG. 3A. Comparator 114 compares a divided voltage DIV to reference voltage Vref, and outputs a pump enable signal Pump_en, as previously described.

Clock generator 250 generates a reference clock signal CLKin for pumping a voltage to a desired level for voltage generator 100. Clock controller 210 generates a delayed reference clock signal CLKde by delaying reference clock signal CLKin for a predetermined time d (as illustrated in FIG. 3B) and "exclusive ORs" CLKin with CLKde to generate signal S1. That is, in this exemplary embodiment, clock controller 210 performs an XOR logical operation on reference clock signal CLKin and delayed reference clock signal CLKde to produce signal S1. Modified signal S1, also referred to herein as signal S1, is obtained by doubling the frequency of input clock CLKin. To ensure that XOR 214 produces a clock signal, delay d is held to less than half the clock cycle of reference clock signal CLKin.

Clock controller 210 generates a modified enable signal S2 from modified signal S1 according to the pump enable signal Pump_en, and supplies modified enable signal S2 to flip flop 218 so as to change a current logic state of a modified clock signal CLKout at every rising edge of modified enable signal S2. Pump unit 130 pumps a power supply voltage to generate an operating voltage Vout, using modified clock signal CLKout generated by clock driver 200.

For example, if an initial logic state of modified clock signal CLKout stored in flip flop 218 is logic 'low', then modified clock signal CLKout is changed to logic 'high' at a first rising edge of modified enable signal S2, is maintained to be logic 'high', and is then changed to logic 'low' at a second rising edge of modified enable signal S2. On the other hand, if the initial logic state of modified clock signal CLKout stored in flip flop 218 is logic 'high', then modified clock signal CLKout is changed to logic 'low' at the first rising edge of modified enable signal S2, is maintained to be logic 'low', and is then changed to logic 'high' at the second rising edge of modified enable signal S2. Such a logic change is repeatedly performed.

Then, a comparison of pump enable signal Pump_en to the modified clock signal CLKout reveals that the modified clock signal CLKout has a substantially regular pulse form regardless of intervals or edges of pump enable Pump_en. That is, even if the pulse width of the pump enable Pump_en becomes narrow when the pump operation is performed according to the modified clock signal CLKout, i.e., even if a low sink current is supplied to a phase change memory cell, a charge loss is not large, thus preventing degradation in the efficiency of the pump operation.

To summarize: in an exemplary embodiment in accordance with principles of inventive concepts, an input clock signal CLKin is doubled in frequency by EXCLUSIVE ORing the signal with a delayed version of itself. The delay, d, is kept to less than half the pulse-width of clock signal CLKin in order to ensure that a "doubled" clock signal S1 is obtained. That is, if, for example, delay d were exactly the same width and 180 degrees out of phase with clock signal CLKin, the output of XOR gate 214 would remain at a steady "high" logic level, which would not be desirable.

In this exemplary embodiment, signal S1, at double the frequency of input clock signal CLKin, is gated with the output of comparator 114, producing clock signal S2. Clock signal S2 is, therefore, clock signal S1 enabled by pump enable signal Pump_en. That is, when Pump_en is at a logic high level, indicating that output voltage Vout has dropped below a target level, clock signal S1 passes through AND gate 214, unmodified, as clock signal S2. When Pump_en is at a logic low level, indicating that output voltage Vout is at a satisfactorily high level, clock signal S1 is "gated off" by AND gate 214 and, as a result, clock signal S2 is held low.

In this exemplary embodiment, D type flip flop 218 is triggered by the rising edge of clock signal S2 and, because the inverting output QB of flip flop 218 is fed back to its delay input D, output Q will toggle (high-to-low, low-to-high) in response to the rising edge of signal S2. Flip flop 218 will, therefore, yield an output, CLKout, that replicates, to a first order, input clock signal CLKin, with the exceptions that signal CLKout is enabled by pump enable signal Pump_en and it is latched. Because signal CLKout is enabled by Pump_en, a switching input will be provided to charge pump 132 only when output voltage Vout drops below a threshold level, as is desired. And, because signal CLKout is latched by flip flop 218, the duration of pulses provided to charge pump 132 will be sufficient to provide effective operation of charge pump 132. That is, for example, even if pump enable signal Pump_en is activated (goes to a logic "High" in this embodiment) for only a brief period of time, due, for example to relatively low sink current Isink, the duration of CLKout will be sufficient to operate charge pump 130. Such would not be the case if signal CLKout were not latched.

In exemplary embodiments in accordance with principles of inventive concepts, a gated, latched, clock signal, such as signal CLKout may be provided to a pump circuit to operate charge pump 134 and thereby charge capacitor 134, which may be used to supply current Isink to access a phase change memory cell, such as memory cell 20-1 described in the discussion related to FIG. 1.

Figure 4A:
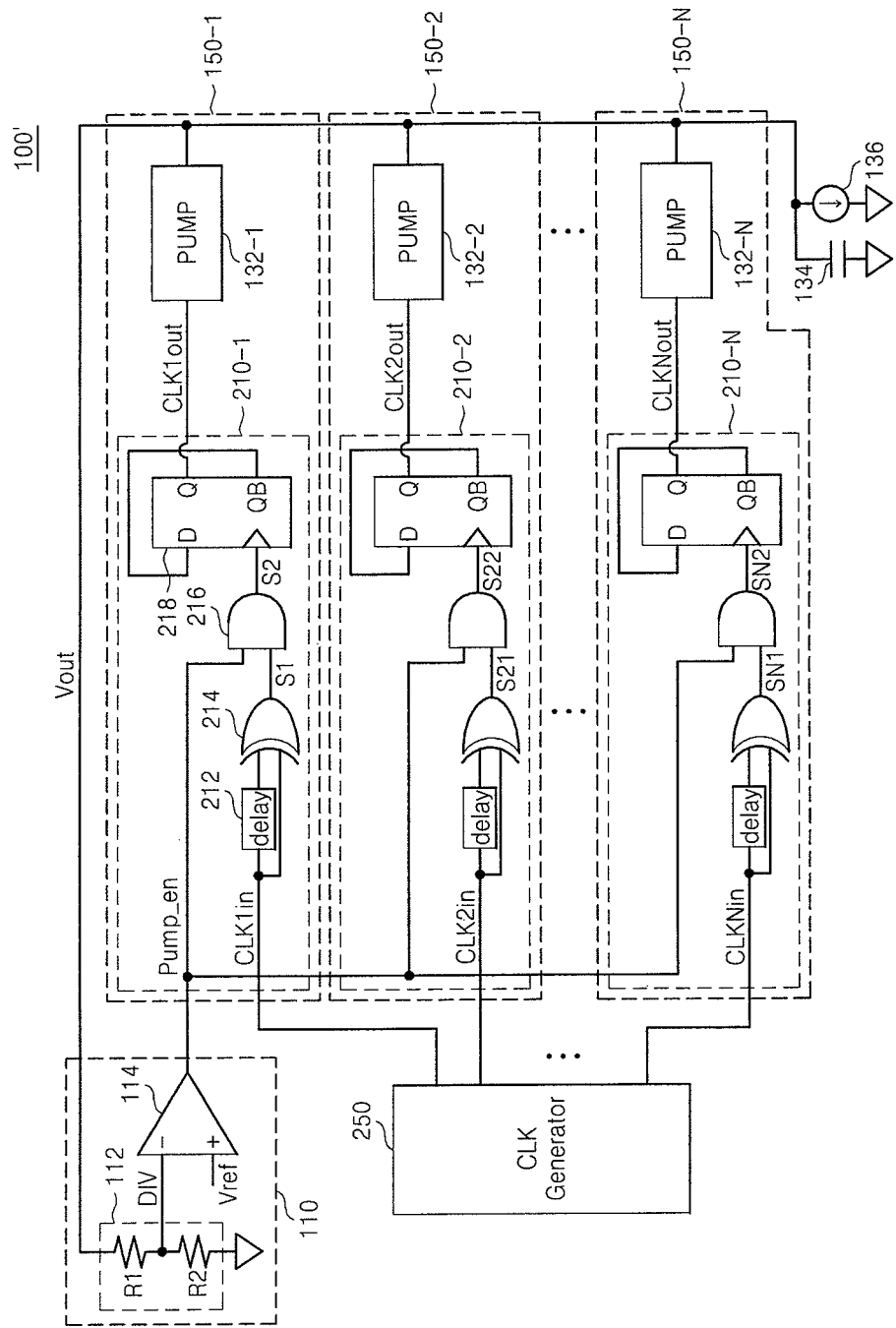
FIG. 4A is a circuit diagram of a voltage generator that is another embodiment of the voltage generator of FIG. 2, according to an exemplary embodiment in accordance with principles of inventive concepts.

Another exemplary embodiment of a voltage generator 100' in accordance with principles of inventive concepts is depicted in the circuit diagram of FIG. 4A. FIG. 4B is a timing diagram of signals generated in voltage generator 100' of FIG. 4A. For convenience of explanation, the exemplary embodiment of FIGS. 4A and 4B will be described focusing primarily on the differences from the previous exemplary embodiment described in relation to the discussion of FIGS. 3A and 3B.

Referring to FIG. 4A, clock driver 210 and pump circuit 132 may be embodied in such a manner that they may be included in each of a plurality of stages 150-1 to 150-N according to characteristics of an operating voltage Vout. Pump circuit 132 may be included in the plurality of stages 150_1 to 150-N as illustrated in FIG. 4A to charge capacitor 134, which may be discharged to provide access current Isink for a phase change memory device 20-1 such as described in the discussion related to FIG. 1. In an exemplary embodiment in accordance with principles of inventive concepts, pump circuit 132 may employ a plurality of stages 150-1 though 150-N in order to provide more fine-grained control over charging capacitor 134. That is, in an exemplary embodiment having a plurality of clock signals CLK1in through CLKNin out-of-phase with one another, pump circuit 132 may be more responsive to transitions in a pump enable signal Pump_en. In such exemplary embodiments one of the CLK1out through CLKNout signals is more likely to regularly commence pumping action proximate the time Pump_en signal transitions to an active state (a logic High state in this exemplary embodiment).

In this exemplary embodiment, level detector 110 compares a divided voltage DIV to a reference voltage Vref and outputs a pump enable signal Pump_en to the plurality of stages 150-1 to 150-N. A plurality of clock controllers 210-1 to 210-N included in the plurality of stages 150-1 to 150-N respectively receive a plurality of reference clock signals CLK1in to CLKNin generated by clock generator 250. In an exemplary embodiment in accordance with principles of inventive concepts, the plurality of reference clock signals CLK1in to CLKNin may have the same cycle but have different phases so that they do not overlap with one another.

Clock controller 210-$k$ included in each of the plurality of stages 150-1 to 150-N generates a modified clock signal CLKkout from pump enable signal Pump_en and a corresponding reference clock signal CLKkin. Here, '$k$' denotes a natural number ranging from '1' to 'N'. Clock controller 210-$k$ includes delayer 212, first logic circuit 214, second logic circuit 216, and flip flop 218, similar to clock controller 210 of FIG. 3A.

Pump circuit 132-$k$ included in each of the plurality of stages 150-1 to 150-N performs a pump operation on a power supply voltage according to the modified clock signal CLKkout to obtain a pumping voltage, charges capacitor 134 with to pumping voltage Vout, which may be employed as an access voltage for a selected phase change memory. Capacitor 134 may be discharged through a selected phase change memory to provide access current 136.

In voltage generator 100' with four multi-stages, illustrated in FIG. 4B, level detector 110 outputs the pump enable signal Pump_en and the clock generator 250 outputs four reference clock signals CLK1in to CLK4 that have the same cycle but do not overlap with one another.

Reference clock signals CLK1in through CLK4 are output as modified clock signals CLK1out to CLK4out via clock drivers 210-1 to 210-4, respectively. Referring to FIG. 4B, compared to pump enable signal Pump_en, the reference clock signals CLK1in to CLK4 each have a substantially regular pulse shape with a constant, predetermined, pulse width, regardless of intervals or edges of pump enable signal Pump_en, which may be due, for example, to variations in a sink current 136. In an exemplary embodiment in accordance with principles of inventive concepts, the preset pulse width is equal to or greater than half a cycle of the reference clock signal CLKin.

Figure 5:
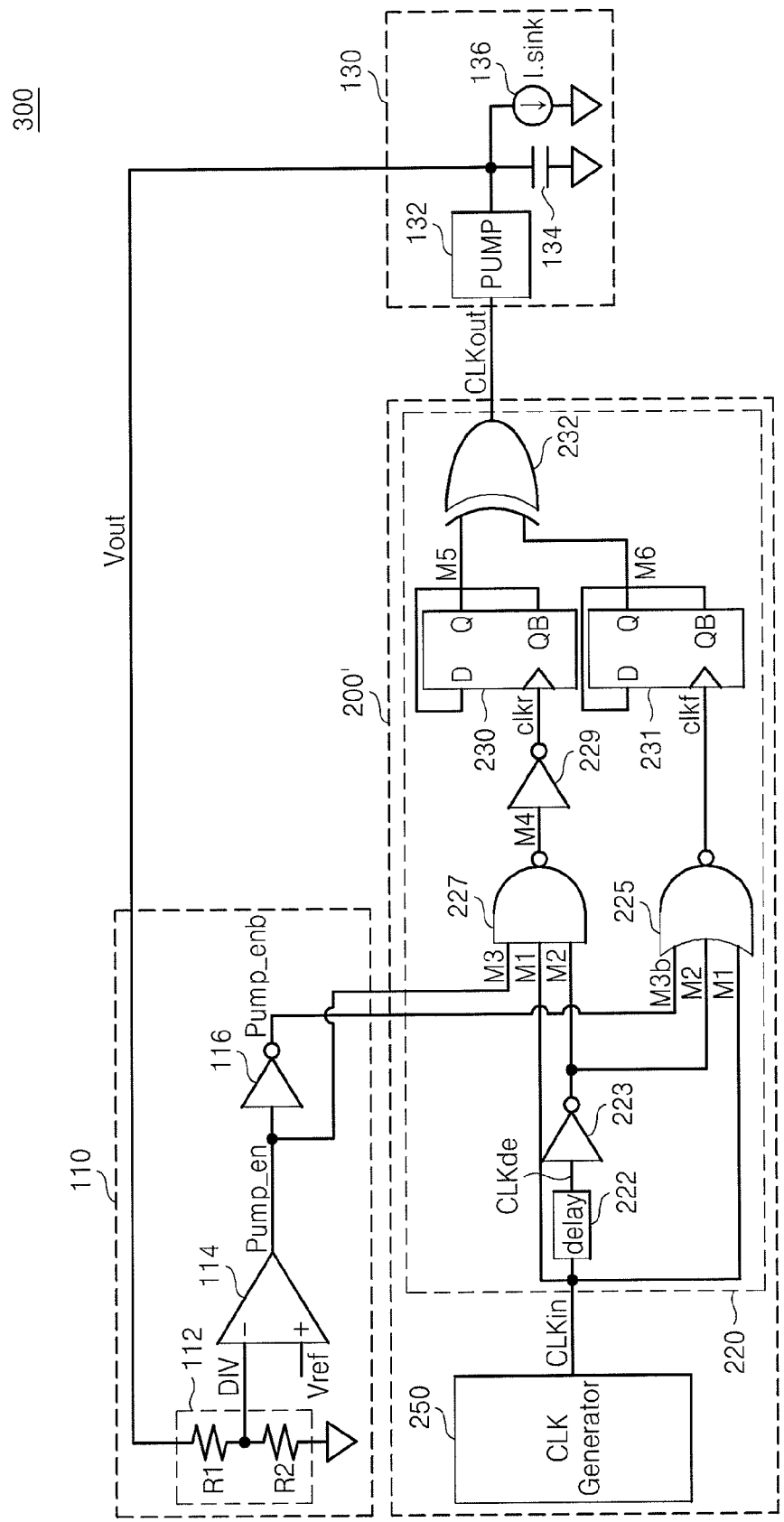
FIG. 5 is a detailed circuit diagram of a voltage generator that is another embodiment of the voltage generator of FIG. 2, an exemplary embodiment in accordance with principles of inventive concepts.
Figure 6:
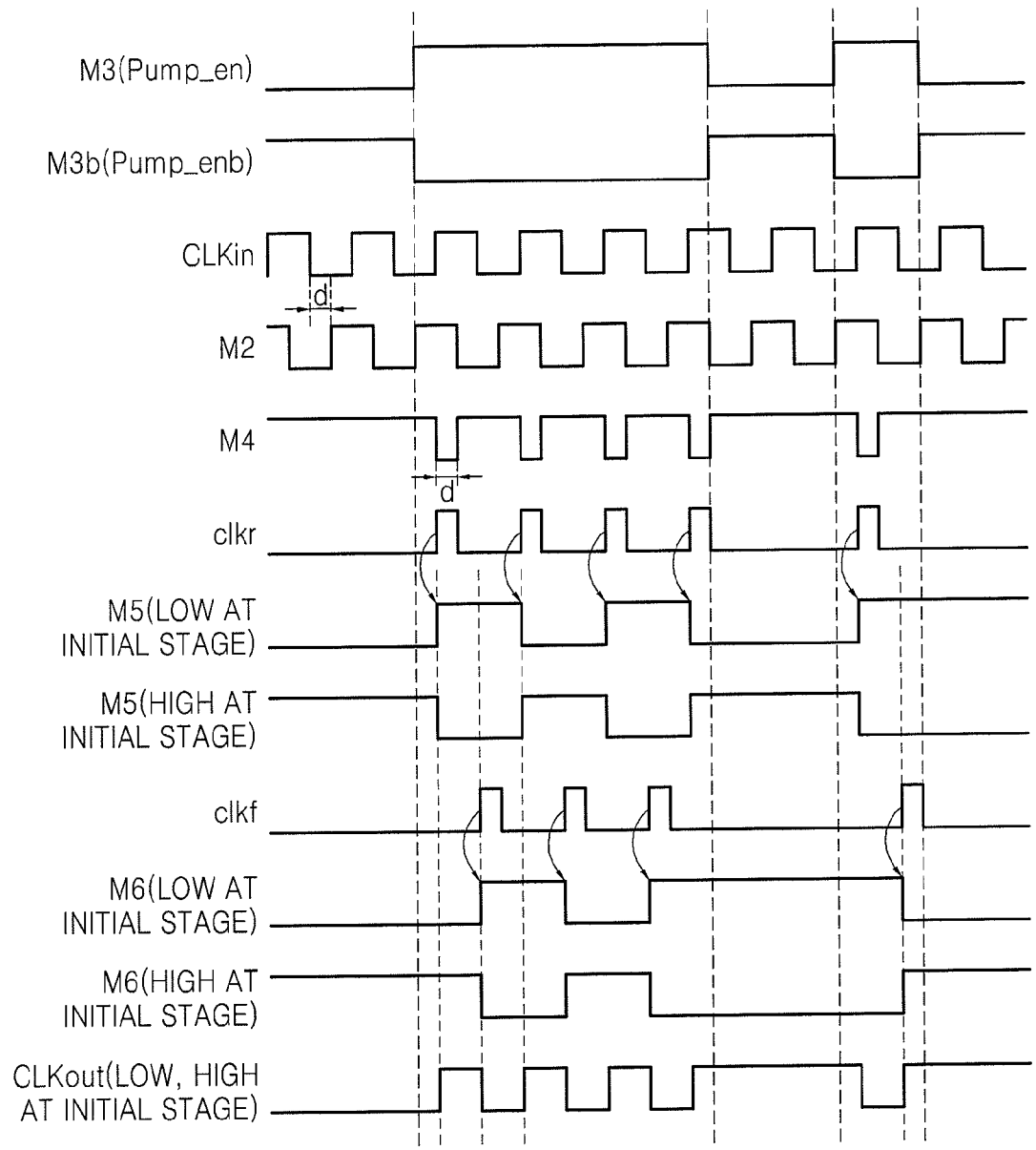
FIG. 6 is a timing diagram of signals generated in the voltage generator of FIG. 5, according to another exemplary embodiment in accordance with principles of inventive concepts.

An exemplary embodiment of a voltage generator 300 in accordance with principles of inventive concepts is depicted in the circuit diagram of FIG. 5. FIG. 6 is a timing diagram of signals generated in voltage generator 300 of FIG. 5, according to an exemplary embodiment in accordance with principles of inventive concepts. For convenience of explanation, the current embodiment of FIGS. 5 and 6 will now be described focusing primarily on the differences from the previous exemplary embodiment of FIGS. 3A and 3B.

Referring to FIG. 5, the voltage generator 300 includes a level detector 110, a clock driver 200', and a pump unit 130.

In an exemplary embodiment, level detector 110 outputs a pump enable signal Pump_en, also referred to herein as an output pump enable signal M3, and an inverted pump enable signal Pump_enb, also referred to herein as output inverted pump enable signal M3$b$. Inverted pump enable signal M3$b$ may be obtained by inverting pump enable signal Pump_en by using a first inverter 116, for example. Clock driver 200' includes clock generator 250 and clock generator 220. Clock generator 250 generates reference clock signal CLKin, also referred to herein as reference clock signal M1. Clock controller 220 generates modified clock signal CLKout from output reference clock signal M1 inverted clock signal M2, which is obtained by delaying and inverting the output reference clock signal M1, long with output pump enable signal M3 and inverted pump enable signal M3b. Signals M3 and M3b may be used to gate signals M1 and M2 in a manner similar to that in which signal Pump_en was used to gate signal S1 in the exemplary embodiment of FIG. 3A.

Clock controller 220 includes delayer 222, second inverter 223, first logic operation unit 227, second logic operation unit 225, third inverter 229, first flip flop 230, second flip flop 231, and third logic operation unit 232.

Delayer 222 receives output reference clock signal M1 from clock generator 250, delays output reference clock signal M1 for a predetermined time d, and outputs delayed reference clock signal CLKde. Second inverter 223 generates inverted clock signal M2 by inverting delayed reference clock signal CLKde.

First logic operation unit 227 performs a first logic operation on output pump enable signal M3, output reference clock signal M1, and inverted clock signal M2, and then outputs clock signal M4. In an exemplary embodiment in accordance with principles of inventive concepts, the first logic operation may be a NAND operation, as indicated by NAND gate symbol 227. Clock signal M4 is inverted by third inverter 229 and fed to the clock input clkr of D flip flop 230. D flip flop 230 is triggered by the rising edge of signal clkr.

Second logic operation unit 225 performs a second logic operation on inverted pump enable signal M3b, inverted clock signal M2, and output reference clock signal M1 and outputs clock signal clkf, also referred to herein as falling clock signal clkf. In an exemplary embodiment in accordance with principles of inventive concepts, the second logic operation may be a NOR operation, as indicated by NOR gate symbol 225. In an exemplary embodiment in accordance with principles of inventive concepts, as indicated in FIG. 6, the rising edges of signals clkr and clkf may substantially coincide, respectively with the rising and falling edges of input clock signal CLKin and may, therefore, be referred to herein, respectively, as rising clock signal clkr and falling clock signal clkf.

First flip flop 230 generates clock signal M5, the logic state of which changes, or toggles, at the rising edge of clock signal clkr. Although first flip flop 230 is illustrated as a D flip flop in the exemplary embodiment of FIG. 5, inventive concepts are not limited thereto and first flip flop 230 may be embodied as any of other various types of flip fop, such as an RS flip flop, a T flip flop, or a JK flip flop. Because the rising edge of clock signal M5 may substantially coincide with the rising edge of input clock signal CLKin, clock signal M5 may be referred to herein as rising clock signal M5.

Second flip flop 231 generates clock signal M6, the logic state of which toggles at the rising edge of clock signal clkf. Because the rising edge of clock signal M6 may substantially coincide with the falling edge of input clock signal CLKin, clock signal M6 may be referred to herein as falling clock signal M6.

Although second flip flop 231 is illustrated as a D flip flop in the exemplary embodiment of FIG. 5, inventive concepts are not limited thereto and second flip flop 231 may be embodied as any of other various types of flip fops, such as, an RS flip flop, a T flip flop, or a JK flip flop.

Third logic operation unit 232 performs a third logic operation on clock signals M5 and M6 to produce clock signal CLKout. Third logic operation may be an XOR operation, as indicated by XOR gate 232 in FIG. 5. Pump circuit 132 generates an operating voltage Vout by performing the pump operation on a power supply voltage according to clock signal CLKout, which is, similar to CLKout signal of FIG. 3A, gated by Pump_en signal and latched.

Output pump enable signal M3 and inverted output pump enable signal M3b are output from level detector 110 as a result of comparing divided voltage DIV, which is obtained by dividing operating voltage Vout, to reference voltage Vref. Clock driver 220 receives reference clock signal CLKin from clock generator 250, and generates delayed reference clock signal CLKde and inverted clock signal M2. Delayed reference clock signal CLKde is obtained by delaying reference clock signal CLKin for a predetermined time d, and may have substantially the same cycle and pulse width as reference clock signal CLKin. Clock driver 220 generates clock signal M4 by performing a first logic operation on output pump enable signal M3, output reference clock signal M1, and inverted clock signal M2. The first logic operation may be the NAND operation. Clock signal clkr is obtained by inverting the basic rising clock signal M4.

The non-inverting output Q of first flip flop 230 outputs clock signal M5, stored, or latched, in first flip flop 230 in response to the rising edge of clock signal clkr. Because the inverted output of flip flop 230 is connected to the delay input D of flip flop 230, output M5 will toggle in response to the rising edge of clock input clkr.

The non-inverting output Q of second flip flop 231 clock signal M6, stored, or latched, in second flip flop 231, in response to the rising edge of clock signal clkf. Because the inverted output of flip flop 231 is connected to the delay input D of flip flop 231, output M6 will toggle in response to the rising edge of clock input clkf.

Clock driver 220 performs the third logic operation on clock signal M5 and clock signal M6, and then outputs clock signal CLKout. In this exemplary embodiment in accordance with principles of inventive concepts, output clock signal will have the same frequency and phase, regardless of the starting state of the signal at the beginning of a pump enable period. That is, in this embodiment, as illustrated for example in the timing diagram of FIG. 6, regardless of the initial states of signal M5 or of signal M6, signal CLKout has the same value. This is not the case with the exemplary embodiment described in the discussion related to FIGS. 3A and 3B, in which the value of output clock signal CLKout depends upon the starting value of output clock signal CLKout. As with other exemplary embodiments in accordance with principles of inventive concepts, in this exemplary embodiment, clock signals are latched and, therefore, clock pulses of sufficient width will be delivered to pump 132, even if the Pump_en signal is activated for only a brief period (due, for example, to a relatively low level Isink current).

Figure 7:
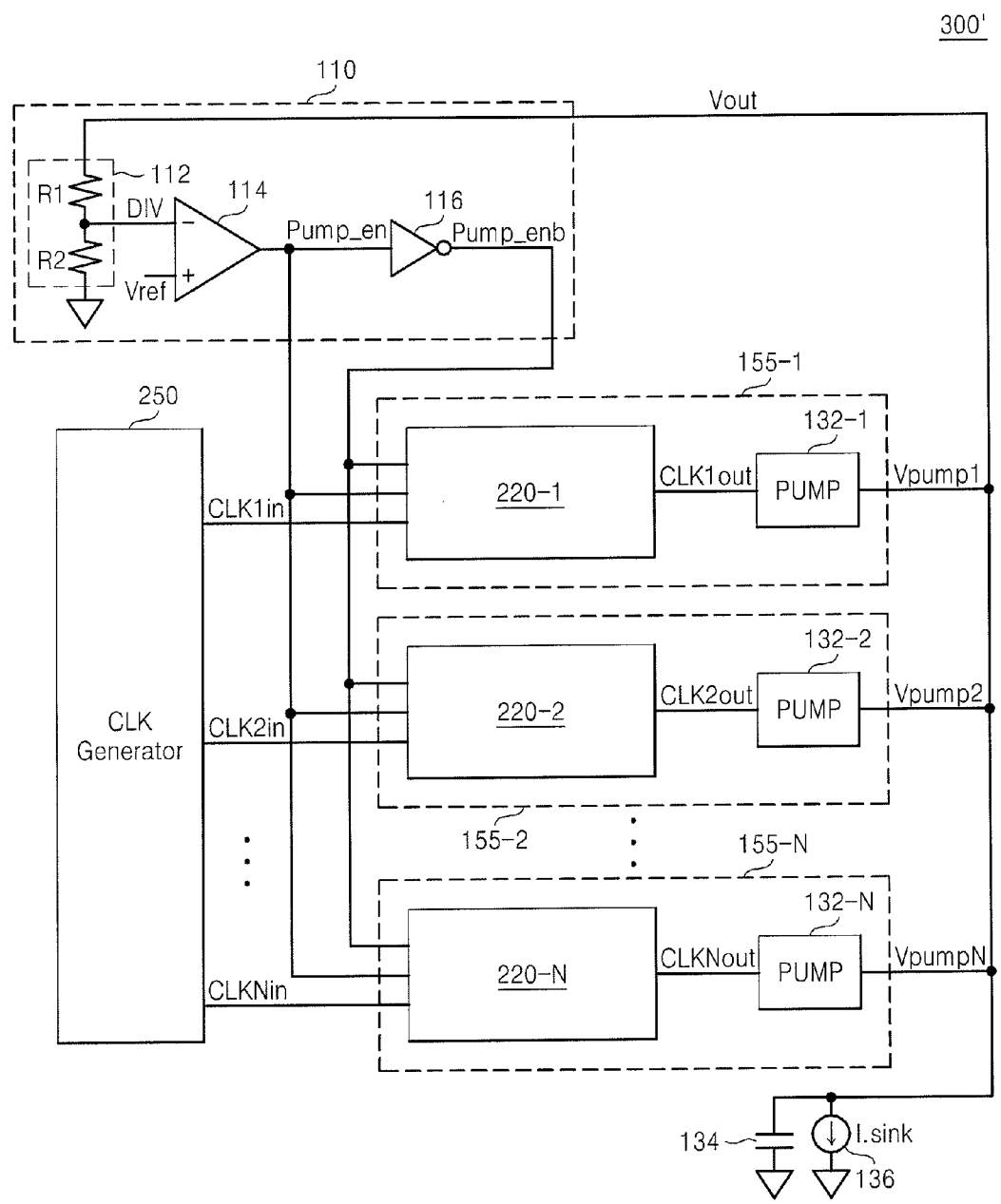
FIG. 7 is a block diagram of a voltage generator including a clock controller of FIG. 5, according to another exemplary embodiment in accordance with principles of inventive concepts.

FIG. 7 is a block diagram of a voltage generator 300' including clock generator 220 of FIG. 5, according to another embodiment in accordance with principles of inventive concepts. Clock driver 210 and pump circuit 132 illustrated in FIG. 3A may be embodied in such a manner that they may be included in each of a plurality of stages 155-1 to 155-N.

Level detector 110 compares a divided voltage DIV with reference voltage Vref, and outputs pump enable signal Pump_en and inverted pump enable signal Pump_enb to the plurality of stages 155-1 to 155-N. A plurality of clock controllers 220-1 to 220-N included in the plurality of stages 155-1 to 155-N receive a plurality of reference clock signals CLK1in to CLKNin generated by clock generator 250, respectively. In this exemplary embodiment in accordance with principles of inventive concepts, the plurality of reference clock signals CLK1in to CLKNin may have the same cycle but different phases, so that they do not overlap with one another.

In each of the plurality of stages 155-1 to 155-N, clock controller 220-k generates a modified clock signal CLKkout from the pump enable signal Pump_en, inverted pump enable signal Pump_enb, and a reference clock signal CLKkin. Here, 'k' denotes a natural number ranging from '1' to 'N'. Clock controller 220-k may have the same structure as clock controller 220 illustrated in FIG. 5.

In the plurality of stages 155-1 to 155-N, pump circuits 132-k generate pumping voltages by respectively performing the pump operation on a power supply voltage according to the corresponding modified clock signals CLKkout, combine the pumping voltages together, and then outputs an operating voltage Vout.

Figure 8:
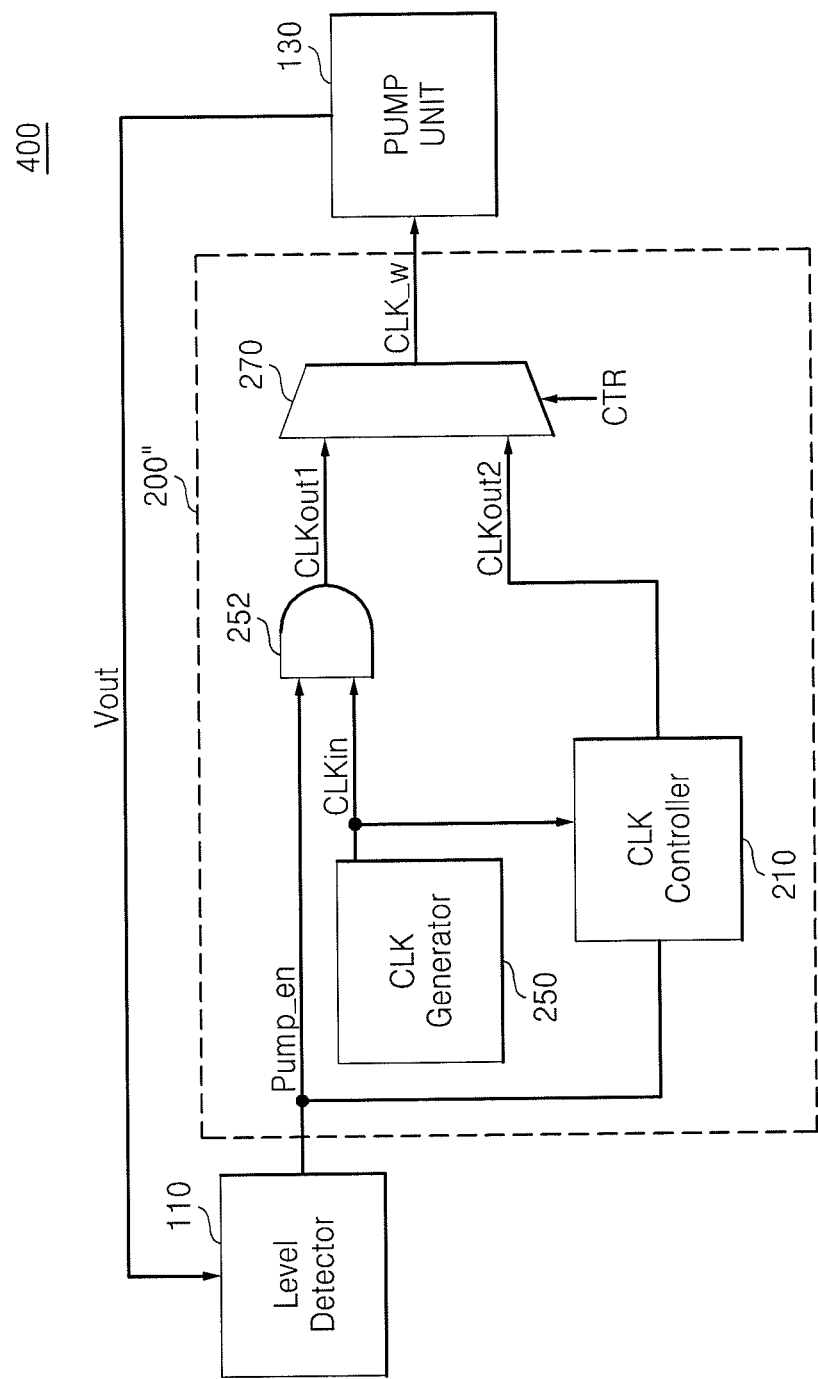
FIG. 8 is a block diagram of a voltage generator that is another embodiment of the voltage generator illustrated in FIG. 1, according to an exemplary embodiment in accordance with principles of inventive concepts.

FIG. 8 is a block diagram of voltage generator 400 that is another exemplary embodiment of voltage generator 100 of FIG. 1 in accordance with principles of inventive concepts. Referring to FIG. 8, voltage generator 400 includes a level detector 110, a clock driver 200", and a pump unit 130. For convenience of explanation, voltage generator 400 will be described focusing on differences from voltage generator 100 of FIG. 2.

Clock driver 200" may include clock generator 250, clock controller 210, logic operation unit 252, and selector 270. Selector 270 may select a clock signal CLKout1 or clock signal CLKout2 and output the selected signal to pump unit 130, according to control signal CTR. Clock signals CLKout1 and CLKout2 may be generated from any combination of clock generators in accordance with the principles of inventive concepts, such as clock generator 250 and clock generator 210, for example. Control signal CTR may be output from control logic 30 of the phase change memory device 1 of FIG. 1. Control logic 30 may control the pump operation to be performed by selecting one of various signals according to various embodiments of the inventive concept, by using the control signal. For example, clock signal CLKout2 may be selected when a high voltage should be precisely generated and used to perform, for example, a program operation, and clock signal CLKout1 may be selected to perform, for example, an erase operation or a read operation.

Figure 9:
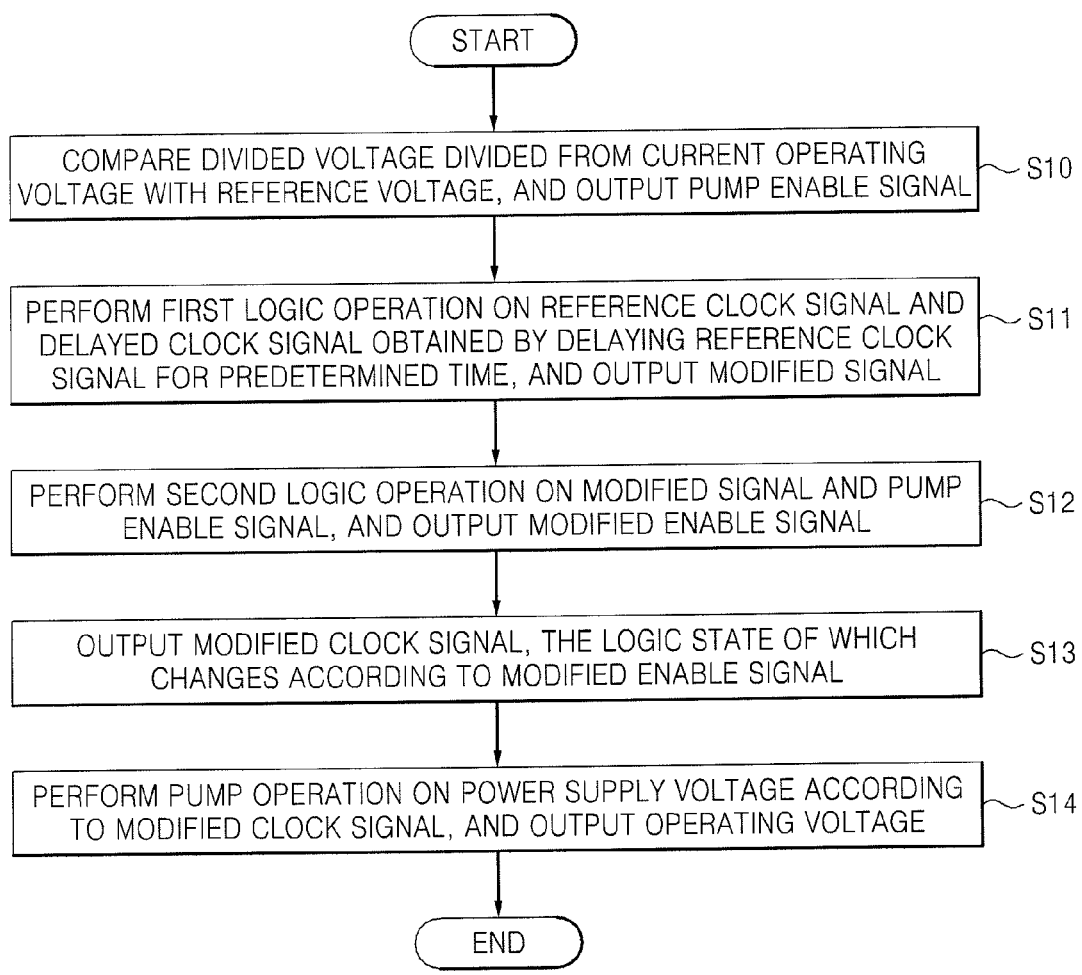
FIG. 9 is a flowchart illustrating a method of controlling a pump operation, performed by the voltage generator of FIG. 2, according to an exemplary embodiment in accordance with principles of inventive concepts.

FIG. 9 is a flowchart illustrating a method of controlling the pump operation, performed by voltage generator 100 of FIG. 2 in accordance with principles of inventive concepts. Referring to FIG. 9, first, level detector 110 compares a divided voltage DIV, which is obtained by dividing a current operating voltage to generate a new operating voltage, to reference voltage Vref, and then outputs a pump enable signal Pump_en as a compared result (operation S10).

Clock driver 200 performs a first logic operation on reference clock signal CLKin and delayed reference clock signal CLKde obtained by delaying reference clock signal CLKin for a predetermined time d, and then outputs a modified signal S1 (operation S11). Then, clock driver 200 performs a second logic operation on modified signal S1 and pump enable signal Pump_en, and then outputs modified enable signal S2 (operation S12). Then, modified clock signal CLKnout, the current logic state of which is maintained constant until modified enable signal S2 has a first edge (operation S13).

Then, pump unit 130 performs the pump operation on a power supply voltage according to modified clock signal CLKnout, and then outputs an operating voltage Vout (operation S14).

Figure 10:
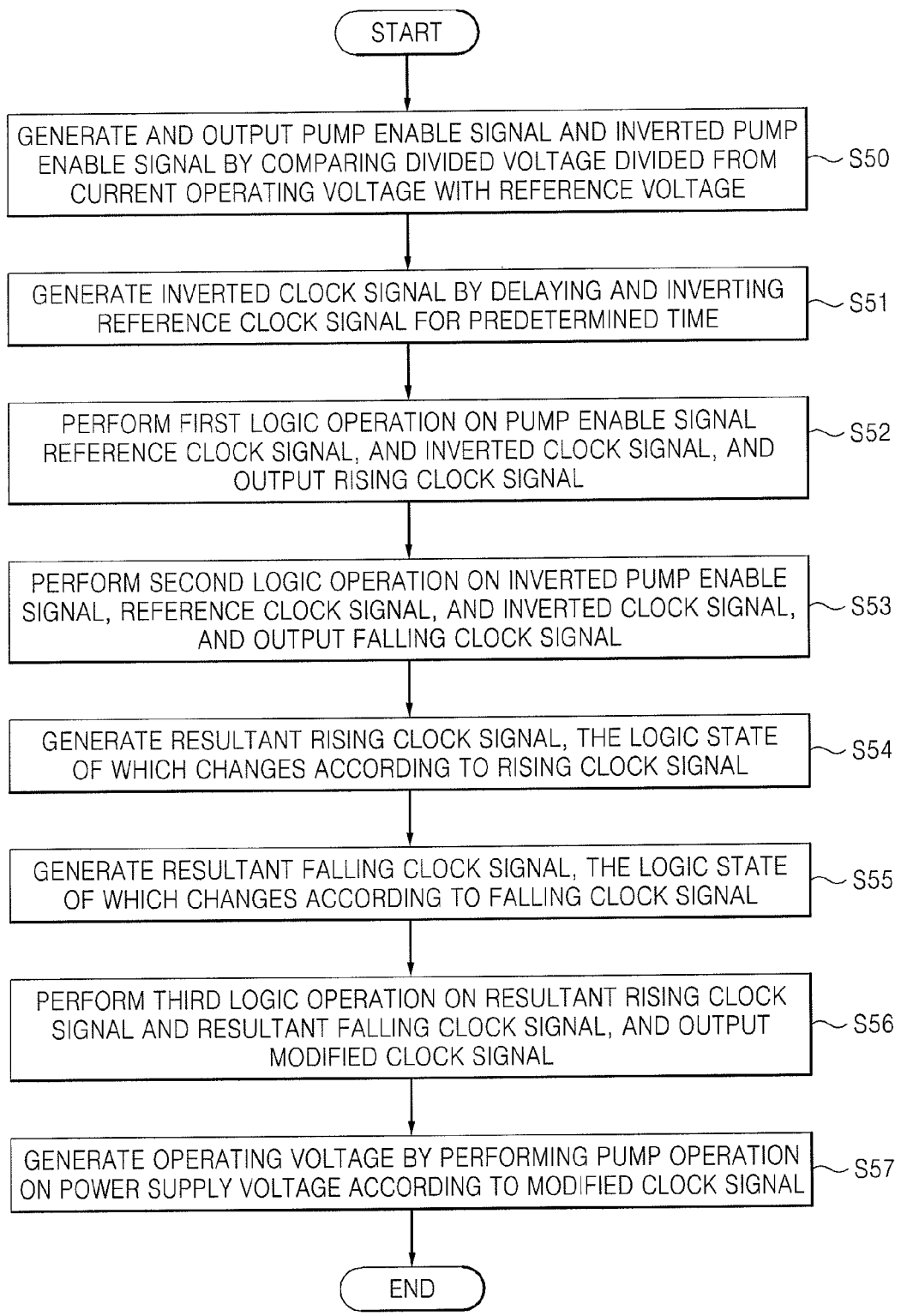
FIG. 10 is a flowchart illustrating a method of controlling a pump operation, performed by the voltage generator of FIG. 5, according to another exemplary embodiment in accordance with principles of inventive concepts.

FIG. 10 is a flowchart illustrating a method of controlling the pump operation, performed by voltage generator 300 of FIG. 5, in accordance with principles of inventive concepts. Referring to FIG. 10, first, level detector 110 compares a divided voltage DIV, which is obtained by dividing a current operating voltage to generate a new operating voltage, to reference voltage Vref, and then outputs a pump enable signal M3 and an inverted pump enable signal M3b (operation S50).

Then, clock driver 200' generates an inverted clock signal M2 by delaying and inverting reference clock signal M1 for a predetermined time (operation S51). Then, clock driver 200' performs a first logic operation on pump enable signal M3, reference clock signal M1, and inverted clock signal M2, and then outputs a rising clock signal clkr (operation S52). Then, clock driver 200' performs a second logic operation on inverted pump enable signal M3b, reference clock signal M1, and inverted clock signal M2, and then outputs falling clock signal clkf (operation S53).

Then, clock driver 200' generates a resultant rising clock signal M5, the logic state of which changes according to rising clock signal clkr (operation S54). Then, clock driver 200' generates a resultant falling clock signal M6, the logic state of which changes according to falling clock signal clkf (operation S55). Then, clock driver 200' performs a third logic operation on resultant rising clock signal M5 and resultant falling clock signal M6, and then outputs modified clock signal CLKout (operation S56).

Thereafter, pump unit 130 generates and outputs an operating voltage Vout by performing the pump operation on a power supply voltage according to modified clock signal CLKout (operation S57).

Figure 11:
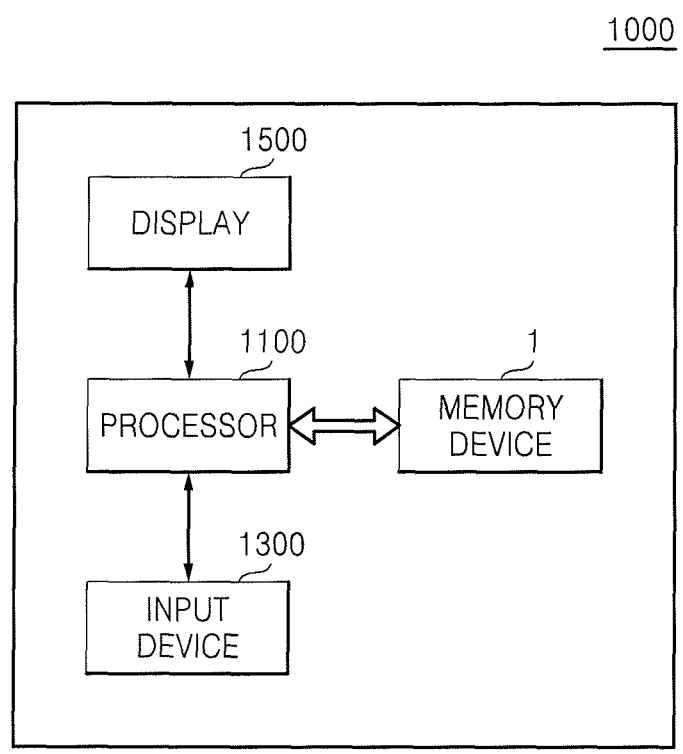
FIG. 11 is a block diagram of a memory system including the phase change memory device illustrated in FIG. 1 according to an exemplary embodiment in accordance with principles of inventive concepts.

FIG. 11 is a block diagram of a memory system 1000 including a phase change memory device in accordance with principles of inventive concepts such as described in the discussion related to FIG. 1. Memory system 1000 may be implemented as a data processing device like a tablet PC, a net-book, an e-reader, a PDA, a portable multimedia player (PMP), an MP3 player, a mobile phone, a smart phone, a wireless internet device, or an MP4 player, for example.

Memory system 1000 includes phase change memory device 1 and processor 1100 controlling data processing operations of non-volatile memory device 10. Processor 1100 may display data stored in phase change memory device 1 through a display 1500 according to data input through input device 1300. Input device 1300 may be implemented by a pointing device such as a touch pad or a computer mouse, a keypad, or a keyboard, for example.

Figure 12:
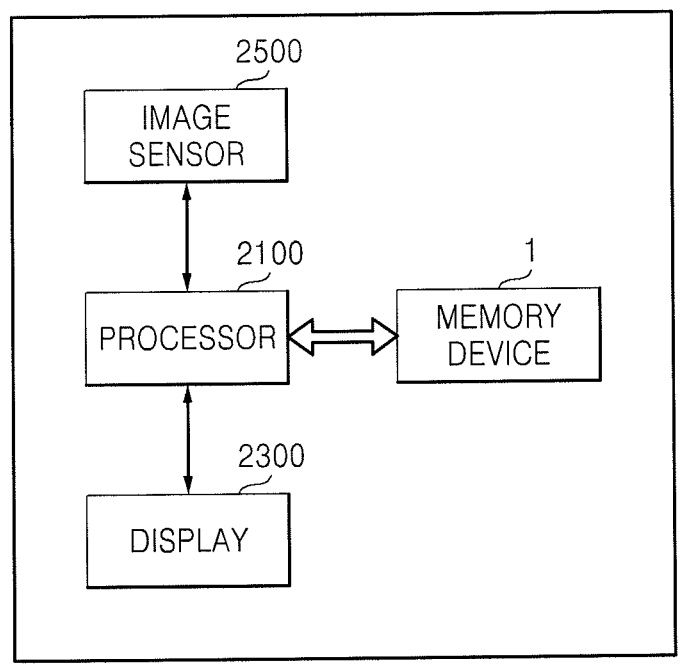
FIG. 12 is a block diagram of a memory system including the phase change memory device illustrated in FIG. 1 according to an exemplary embodiment in accordance with principles of inventive concepts.

FIG. 12 is a block diagram of a memory system 2000 including a phase change memory device 1 in accordance with principles of inventive concepts. Memory system 2000 may be implemented as an image processor like a digital camera, or a mobile phone equipped with a digital camera, for example.

Memory system 2000 includes phase change memory device 1, which may store program data and processor 2100 controlling data processing operations of phase change memory device 1. Image sensor 2500 included in memory system 2000 converts optical images into digital signals. The digital signals may be controlled by processor 2100 to be displayed through a display 2300 or stored in phase change memory device 1. Digital signals stored in phase change memory device 1 may be displayed through display 2300 according to the control of processor 2100.

Figure 13:
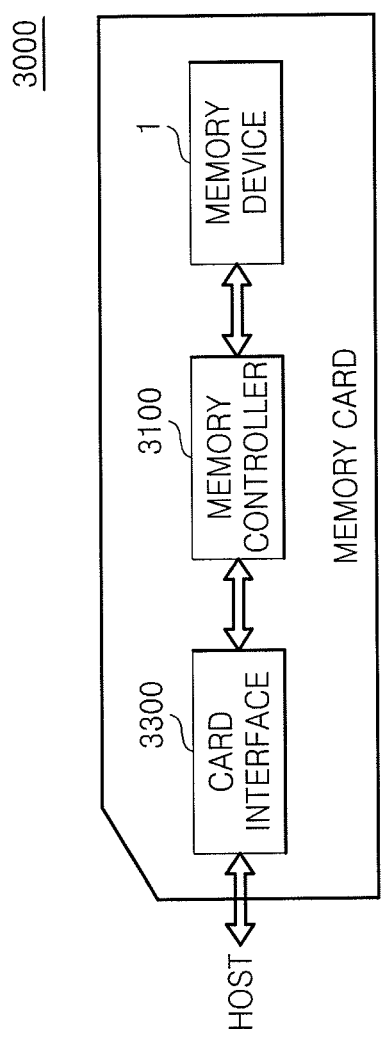
FIG. 13 is a block diagram of a memory system including the phase change memory device illustrated in FIG. 1 according to an exemplary embodiment in accordance with principles of inventive concepts.

FIG. 13 is a block diagram of a memory system 3000 including a phase change memory device 1 in accordance with principles of inventive concepts. Memory system 3000 may be implemented as a memory card or a smart card, for example. Memory system 3000 includes phase change memory device 1, memory controller 3100, and card interface 3300.

Memory controller 3100 may control data exchange between phase change memory device 1 and card interface 3300. Card interface 3300 may be a secure digital (SD) card interface or a multi-media card (MMC) interface, for example.

Card interface 3300 may interface a host and memory controller 3100 for data exchange according to a protocol of the host.

When the memory system 3000 is connected with host 330 such as a PC, a tablet PC, a digital camera, a digital audio player, a cellular phone, a console video game hardware, or a digital set-top box, for example, the host may perform data communication with phase change memory device 1 through card interface 3300 and memory controller 3100.

As described above, a voltage generator, such as a charge pump, in accordance with principles of inventive concepts employs a clock signal having substantially the same pulse width as a reference clock signal, even when an otherwise disruptive event, such as a low sink current supplied to a phase change memory cell, might otherwise alter characteristics of the clock signal.

While inventive concepts have been shown and described with reference to exemplary embodiments thereof, it will be understood that various changes in form and details may be made therein without departing from the spirit and scope of the following claims.

What is claimed is:

1. A phase change memory device comprising:
   a voltage generator responsive to a pump enable signal, the voltage generator generating an operating voltage by generating at least one modified clock signal, a pulse width of which is maintained constant for at least one clock cycle, and performing a pump operation on a power supply voltage according to the at least one modified clock signal; and
   a memory cell array including a plurality of phase change memory cells connected between word lines and bit lines,
   wherein the operating voltage is applied to the memory cell array so as to perform a data access operation.

2. The phase change memory device of claim 1, wherein the pulse width of the at least one modified clock signal is maintained to be equal to or greater than half a pulse width of the at least one reference clock signal.

3. The phase change memory device of claim 1, wherein the voltage generator comprises:
   a level detector that compares a divided voltage of a current operating voltage with a reference voltage and then outputs the pump enable signal; a clock driver that generates the at least one modified clock signal, the pulse width of which is maintained constant while the pump enable signal is enabled; and
   a pump unit that generates the operating voltage by performing the pump operation on the power supply voltage according to the at least one modified clock signal,
   wherein the clock driver comprises:
   a clock generator that generates the at least one reference clock signal; and
   a clock controller that generates the at least one modified clock signal, the pulse width of which is maintained constant while the pump enable signal is enabled.

4. The phase change memory device of claim 3, wherein the clock controller comprises:
   a delayer that delays the at least one reference clock signal for a predetermined time and then outputs a delayed reference clock signal;
   a first logic operation unit that performs a first logic operation on the at least one reference clock signal and the delayed reference clock signal to generate a modified signal;
   a second logic operation unit that performs a second logic operation on the pump enable signal and the modified signal to generate a modified enable signal; and
   a flip flop that outputs the at least one modified clock signal, a current logic state of which is maintained constant until the modified enable signal has a first edge.

5. The phase change memory device of claim 1, wherein the voltage generator comprises:
   a level detector that compares a divided voltage of a current operating voltage with a reference voltage and then outputs the pump enable signal;
   a clock generator that generates N reference clock signals having different phases, where N denotes an integer greater than '1';
   N-stage clock controllers that generates N modified clock signals, the pulse widths of which are maintained constant while the pump enable signal is enabled, from the N reference clock signals, respectively; and
   N-stage pump units that generates N pumping voltages by performing the pump operation on the power supply voltage according to the N modified clock signals, respectively,
   wherein the pumping voltages are added together to be output as the operating voltage.

6. The phase change memory device of claim 5, wherein each of the N-stage clock controllers comprises:
   a delayer that delays one of the N reference clock signals for a predetermined time and then outputting a delayed reference clock signal;
   a first logic operation unit that performs a first logic operation on one of the N reference clock signals and the delayed reference clock signal to generate a modified signal;
   a second logic operation unit that performs a second logic operation on the pump enable signal and the modified signal to generate a modified enable signal; and
   a flip flop that outputs one of the N modified clock signals, a current logic state of which is maintained constant until the modified enable signal has a first edge.

7. The phase change memory device of claim 1, wherein the voltage generator comprises:
   a level detector that generates the pump enable signal and an inverted pump enable signal by comparing a divided voltage of a current operating voltage with a reference voltage;
   a clock driver comprising:
   a clock generator that generates the at least one reference clock signal; and
   a clock controller that generates the at least one modified clock signal, the pulse width of which is maintained constant, from the at least one reference clock signal and an inverted clock signal according to the pump enable signal or the inverted pump enable signal, where the inverted clock signal is obtained by delaying and inverting the at least one reference clock signal, and a pump unit that generates the operating voltage by performing the pump operation on the power supply voltage according to the at least one modified clock signal.

8. The phase change memory device of claim 7, wherein the clock controller comprises:
   a first logic operation unit that performs a first logic operation on the at least one reference clock signal, the inverted clock signal, and the pump enable signal to generate a first signal;
   a second logic operation unit that performs a second logic operation on the at least one reference clock signal, the inverted clock signal, and the inverted pump enable signal to generate a second signal;
   a first flip flop that outputs a third signal, a current logic state of which is maintained constant until the first signal has a first edge;
   a second flip flop that outputs a fourth signal, a current logic state of which is maintained constant until the second signal has a first edge; and
   a third logic operation unit that performs a third logic operation on the third signal and the fourth signal to generate the at least one modified clock signal.

9. The phase change memory device of claim 1, wherein the voltage generator comprises:
   a level detector that compares a divided voltage of a current operating voltage with a reference voltage and then outputs the pump enable signal and an inverted pump enable signal;
   a clock generator that generates N reference clock signals having different phases, where N denotes an integer greater than '1'; and
   N-stage clock controllers each that generates one of the at least one modified clock signal, the pulse width of which is maintained constant from one of the at least one reference clock signal and an inverted clock signal according to the pump enable signal or the inverted pump enable signal, where the inverted clock signal is obtained by delaying and inverting one of the at least one reference clock signal; and
   N-stage pump units that generate N pumping voltages by performing the pump operation on the power supply voltage according to the at least one modified clock signal, respectively,
   wherein the N pumping voltages are added together to be output as the operating voltage.

10. The phase change memory device of claim 3, wherein the clock driver further comprises:
    a logic operation unit that generates a previous modified clock signal by performing a logic operation on the at least one reference clock signal and the pump enable signal; and
    a selector that selects one of the previous modified clock signal and the at least one modified clock signal according to a control signal.

11. A memory system comprising:
the phase change memory device of claim 1; and
a processor configured to control the operations of the phase change memory device.

12. A memory system comprising:
the phase change memory device of claim 1;
a card interface; and
a memory controller configured to control data exchange between the phase change memory device and the card interface.

* * * * *